US007861768B1

(12) United States Patent
Ghantiwala

(10) Patent No.: US 7,861,768 B1
(45) Date of Patent: Jan. 4, 2011

(54) HEAT SINK

(75) Inventor: Nayana V. Ghantiwala, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1424 days.

(21) Appl. No.: 11/191,343

(22) Filed: Jul. 27, 2005

Related U.S. Application Data

(63) Continuation-in-part of application No. 10/460,629, filed on Jun. 11, 2003, now Pat. No. 6,968,890, and a continuation-in-part of application No. 10/934,958, filed on Sep. 2, 2004, now abandoned.

(51) Int. Cl.
*F28F 7/00* (2006.01)
*H05K 7/20* (2006.01)

(52) U.S. Cl. .............................. 165/104.33; 165/104.21

(58) Field of Classification Search ................ 165/80.3, 165/80.5, 104.21, 104.26, 104.33; 361/697, 361/700; 174/15.2, 16.3; 257/715
See application file for complete search history.

(56) References Cited

U.S. PATENT DOCUMENTS

| | | | |
|---|---|---|---|
| 4,588,023 A | | 5/1986 | Munekawa |
| 5,038,858 A | | 8/1991 | Jordan et al. |
| 5,329,993 A | | 7/1994 | Ettehadieh |
| 5,409,055 A | * | 4/1995 | Tanaka et al. ............ 165/104.33 |
| 5,587,880 A | | 12/1996 | Phillips et al. |
| 5,591,034 A | | 1/1997 | Ameen et al. |
| 5,704,416 A | | 1/1998 | Larson et al. |
| 5,755,278 A | * | 5/1998 | Shinohara et al. ....... 165/104.33 |
| 5,946,190 A | * | 8/1999 | Patel et al. ................... 361/700 |
| 5,950,066 A | | 9/1999 | Hanson et al. |
| 6,054,520 A | | 4/2000 | Washio et al. |
| 6,163,073 A | * | 12/2000 | Patel .............................. 257/712 |
| 6,189,601 B1 | * | 2/2001 | Goodman et al. ............ 165/80.3 |
| 6,397,941 B1 | | 6/2002 | McCullough |
| 6,407,922 B1 | | 6/2002 | Eckblad et al. |
| 6,424,528 B1 | | 7/2002 | Chao |
| 6,466,441 B1 | | 10/2002 | Suzuki |
| 6,535,533 B2 | | 3/2003 | Lorenzen et al. |
| 6,633,484 B1 | | 10/2003 | Lee et al. |
| 6,666,260 B2 | | 12/2003 | Tantoush |
| 6,727,117 B1 | * | 4/2004 | McCoy ......................... 438/106 |

(Continued)

FOREIGN PATENT DOCUMENTS

JP   55065891   5/1980

(Continued)

OTHER PUBLICATIONS

"Therma-Loop .TM.:Loop Heat Pipes and Loop Thermosyphons" product description, from http://www.thermacore.com/thermaloop.htm printed from internet Jun. 8, 2005 pp. 1-4.

(Continued)

*Primary Examiner*—Tho v Duong
(74) *Attorney, Agent, or Firm*—Gazdzinski & Associates, PC

(57) ABSTRACT

A heat sink having an embedded heat pipe and fins attached to opposite sides of a base plate having a heat spreader component made of a diamond copper composite is disclosed. In various embodiments, the diamond copper composite heat spreader contains channels for receiving a main heat pipe as well as auxiliary heat pipes.

25 Claims, 17 Drawing Sheets

U.S. PATENT DOCUMENTS

| | | |
|---|---|---|
| 6,794,030 B1 | 9/2004 | Okada et al. |
| 6,984,888 B2 | 1/2006 | Sung |
| 6,987,318 B2 | 1/2006 | Sung |
| 7,173,334 B2 | 2/2007 | Sung |
| 7,208,192 B2 | 4/2007 | Bunyan et al. |
| 7,268,011 B2 | 9/2007 | Sung |
| 7,339,791 B2 | 3/2008 | Hoover et al. |
| 7,384,821 B2 | 6/2008 | Sung |
| 7,434,308 B2 | 10/2008 | Lu et al. |
| 2002/0008960 A1* | 1/2002 | Mitchell .................... 361/687 |
| 2002/0023733 A1* | 2/2002 | Hall et al. .................. 165/80.3 |
| 2003/0141045 A1* | 7/2003 | Oh et al. ................ 165/104.26 |
| 2004/0212056 A1 | 10/2004 | Chen et al. |
| 2004/0244950 A1* | 12/2004 | Zhou et al. ............. 165/104.21 |
| 2006/0225870 A1 | 10/2006 | Tsai et al. |

FOREIGN PATENT DOCUMENTS

| | | |
|---|---|---|
| JP | 62106960 | 5/1987 |
| JP | 08299632 | 11/1996 |
| JP | 2000233452 | 8/2000 |
| ZA | 9100839 | 11/1991 |

OTHER PUBLICATIONS

"037862 (superceded by 037888) P4 4-U High Perfomance Heat Sink for Use With the Pentium 4 Processor .TM."(423 Pin, Xeon, Foster, Prestonia, Gallatin) product description, from http://www.aavidthermalloy.com/products/microp/037862 4u.shtml printed from internet Jun. 8, 2005 pp. 1-2.

"Therma-Tower TM" product decription, from http://www.thermacore.com/therma tower.htm printed from internet Jun. 8, 2005 pp. 1-2.

* cited by examiner

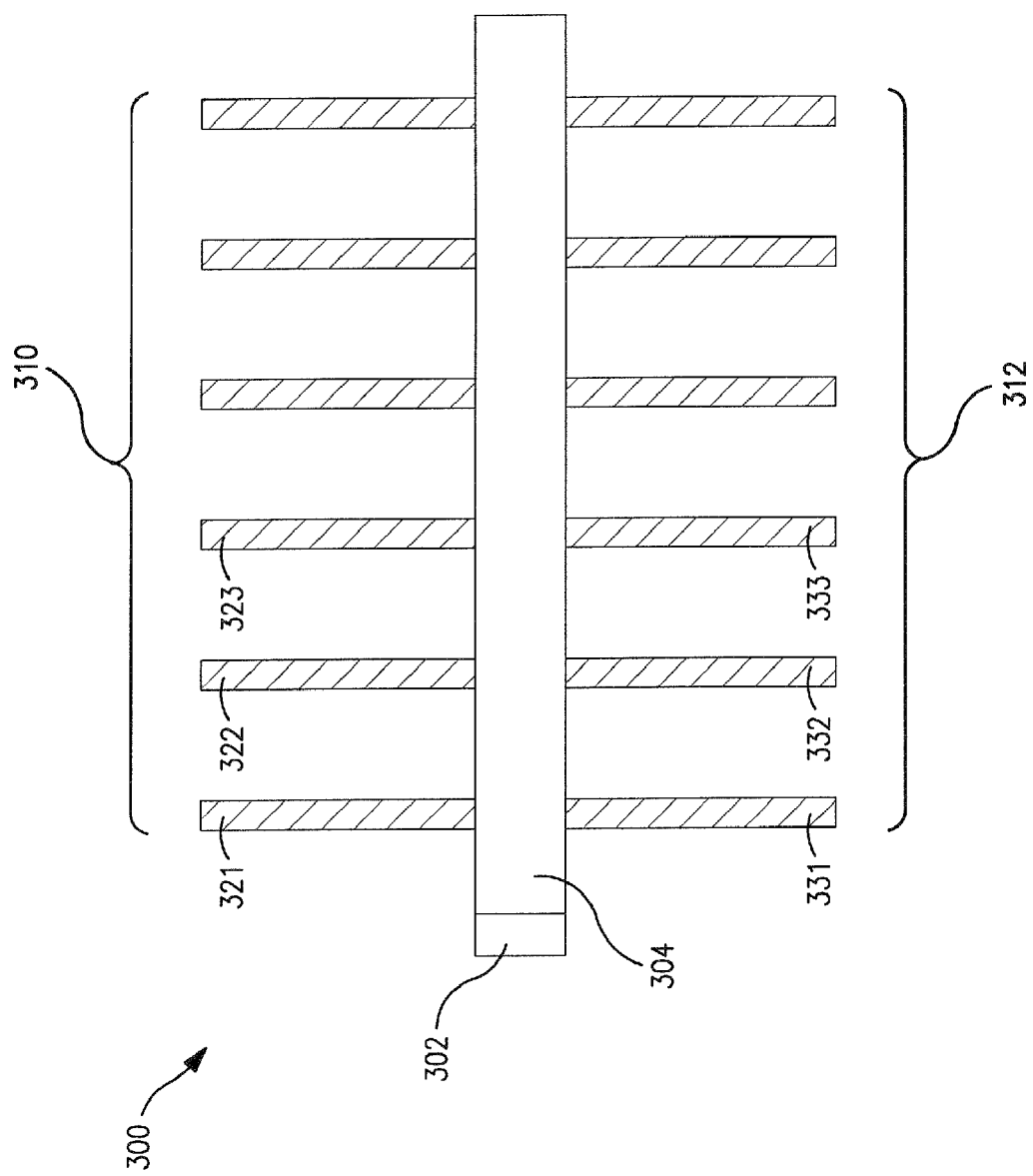

HEAT SINK

RELATED APPLICATIONS

This application is a continuation in part of U.S. patent application Ser. No. 10/460,629, filed Jun. 11, 2003, which is co-pending and incorporated by reference herein in its entirety, and also is a continuation in part of U.S. patent application Ser. No. 10/934,958, filed Sep. 2, 2004, which is co-pending and incorporated by reference herein in its entirety.

TECHNICAL FIELD

The invention relates generally to heat removal devices, and more particularly to a heat sink for electronic components.

BACKGROUND

Electronic components are capable of generating undesirable levels of heat during operation. For example, microprocessors in computer systems can generate enough heat that they can either slow down or cease to function if heat is not removed. Moreover, higher transistor counts on smaller die areas and increasing frequencies of operation clocks have further increased the heat produced by microprocessors. Maintaining actual junction temperatures within a reliable junction value is critical to support higher frequencies and to secure the normal functioning of the electronic components. Thus, dissipation of the heat produced by such electronic components is important to stabilize their operation and extend their operational life.

Existing heat removal devices, such as a fan, employ forced convention. Some electronic systems use one large fan to cool all of the heat-producing components within a system. Other electronic systems have individual fans for each heat-producing element. However, fans often generate unacceptable levels of noise and require separate power sources. Moreover, because fans utilize moving parts, they are susceptible to mechanical failure.

Other heat removing devices employ natural convention in which heat produced by electronic components is dissipated by a heat sink. Prior art heat sinks include heat dissipation fins attached to a base plate. The base plate is meant to spread out the heat produced by the heat-producing element to all the fins. FIG. 1A illustrates a prior art heat sink that includes many thin plates and pins disposed on a base plate. These heat sinks are constructed of materials having high thermal conductivity such as aluminum and copper. Heat produced by the heat-producing element is conducted to the heat dissipation fins via the thermally conductive base section or base plate. The heat is then transferred over the surface of the heat dissipation fins and dissipated into the air blown by a cooling fan.

In order to improve the performance of the cooling device, heat is most desirably distributed evenly throughout the base plate, and dissipated through all of the heat dissipation fins. However, as illustrated in FIG. 1B, heat emitted from the heat-producing element tends to be conducted predominantly to the heat dissipation fins disposed right above the heat-producing element, and the amount of heat conducted to the peripheral heat dissipation fins is relatively small. Because the heat-producing element is much smaller than the base plate, the contact area between them is also very limited. Consequently, the fins as a whole dissipate heat very inefficiently. Moreover, the heat sink is very large relative to the heat source, placing undesirable constraints on the design of a product with high heat generation density.

Thus, to help ensure the continuing safe performance of heat generating electronic components, it is desirable to remove heat from such components in a quiet, efficient and reliable manner. Particularly, what is needed is a heat sink having a highly conductive base plate that maximizes heat dissipation along the entire length and width of the base plate and fins. The thermal properties of such a base plate would enable cooling of components with extremely high heat flux.

SUMMARY

Embodiments of a heat sink having at least one embedded heat pipe and fins attached to opposite sides of a base plate having a diamond copper heat spreader are described. In an embodiment, the base plate includes a main heat pipe and auxiliary heat pipes coupled to the main heat pipe. The fins are aligned with the auxiliary heat pipes.

There are numerous other embodiments that are described herein, and these embodiments generally relate to heat sinks that provide efficient heat dissipation for use in computer systems.

BRIEF DESCRIPTION OF THE DRAWINGS

The present invention is illustrated by way of example, and not limitation, in the figures of the accompanying drawings in which:

FIG. 3B illustrates a front view of an embodiment of a heat sink.

DETAILED DESCRIPTION

In the following description, numerous specific details are set forth such as examples of specific components, circuits, processes, etc., in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The term "coupled" as used herein means connected directly to or indirectly connected through one or more intervening components, structures or elements. The terms "above," "below," and "between" as used herein refer to a relative position of one component or element with respect to other components or elements. As such, one component disposed above or below another component may be directly in contact with the other component or may have one or more intervening component. Moreover, one component disposed between other components may be directly in contact with the other components or may have one or more intervening components.

Embodiments of a heat sink are described. In an embodiment of the present invention, the heat sink is adapted for use in computer assemblies, such as desktop or personal computer systems. In alternative embodiments, the heat sink may be adapted for use with laptops, cell phones, and handheld computers. The heat sink includes a base plate and multiple fins coupled to opposite sides of the base plate. The double-sided fin configuration maximizes the heat dissipated through the base plate by allowing simultaneous axial and lateral heat transmission to all the attached fins. The base plate and fins are made of high heat conducting materials. The base plate also includes one or more embedded heat pipes to form a network that provides greater heat conductivity. Thus the combination of materials, fin orientation, and heat pipes results in a heat sink that can handle the high heat flux challenges in contrast to the prior art.

Figure 1A:
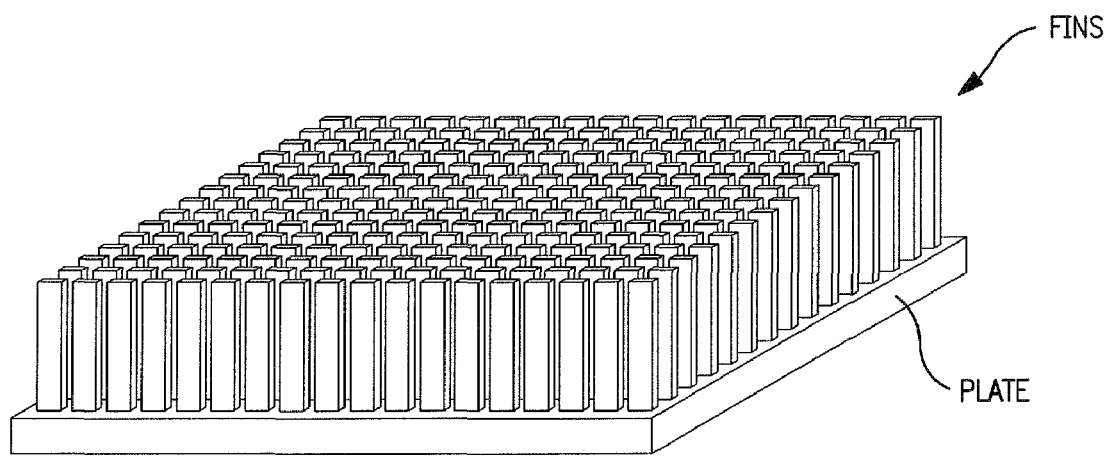
FIG. 1A illustrates a prior art heat sink.
Figure 1B:
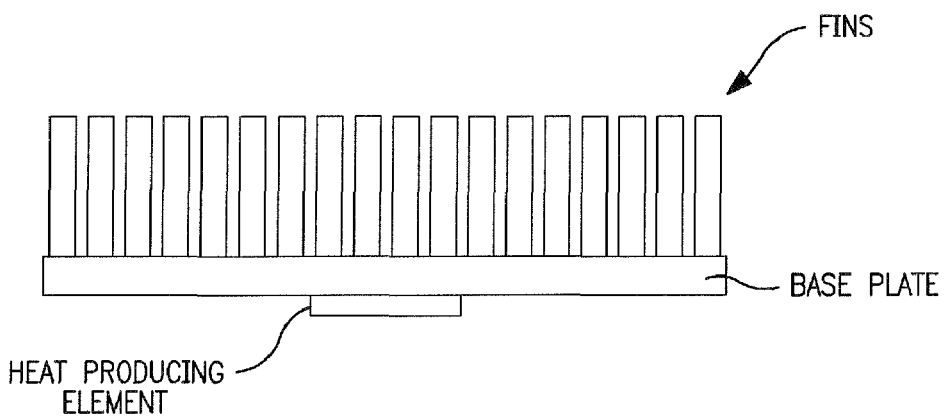
FIG. 1B illustrates another prior art heat sink.
Figure 2:
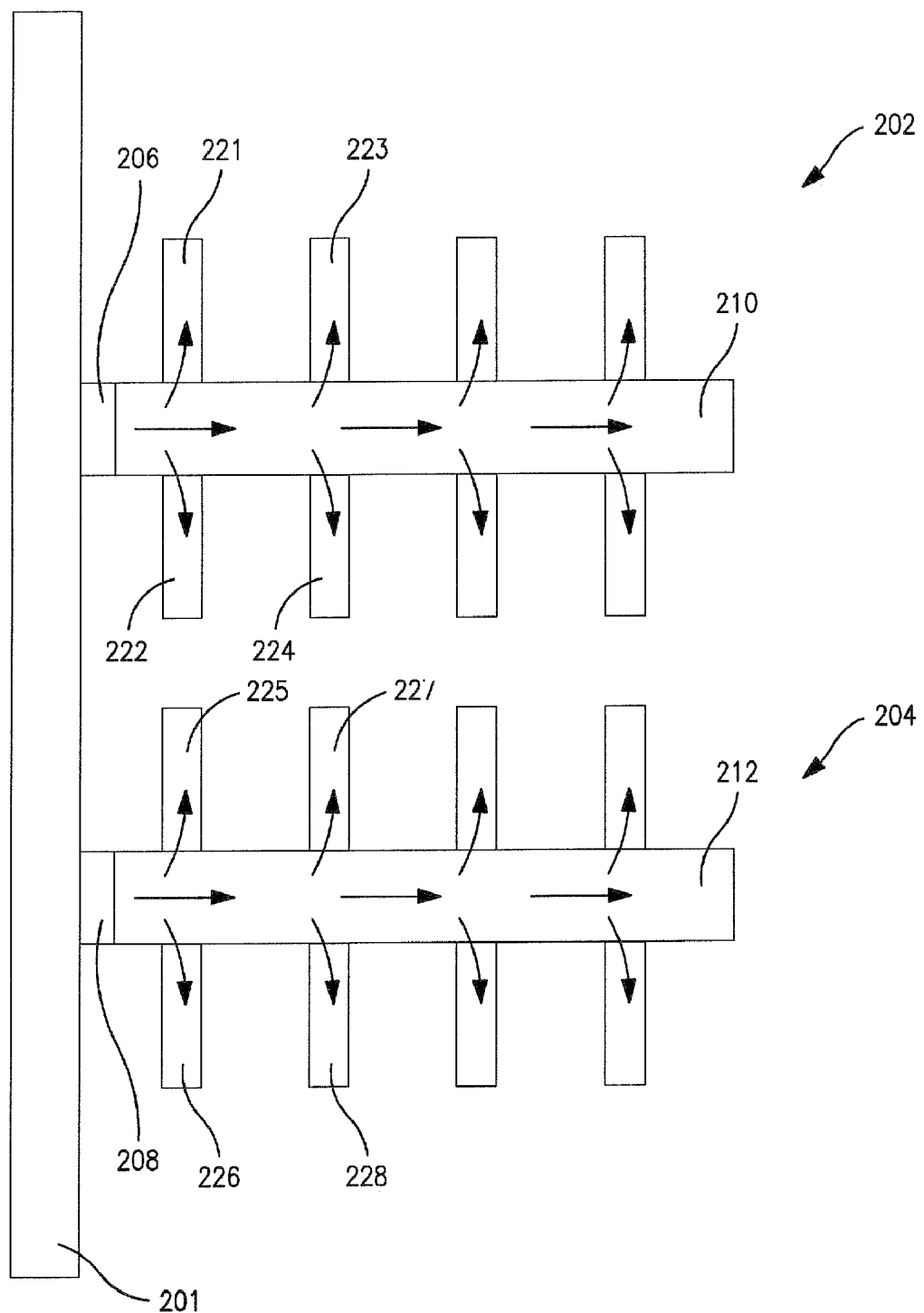
FIG. 2 illustrates an embodiment of a heat sink.

FIG. 2 illustrates an embodiment of a heat sink that may be used to dissipate heat from electronic components, for example, a microprocessor on a printed circuit board ("PCB") in a computer system (e.g., a motherboard). Typically, PCBs have heat-producing elements such as microprocessors or power supplies mounted on one or more surfaces. FIG. 2 illustrates two heat-generating sources in the form of central processing units ("CPUs") 206 and 208 disposed on a motherboard 201. Motherboard 201 is oriented vertically as would be mounted, for example, in a tower case or chassis of a computer system. Heat sink 202 is disposed over heat source 206 and heat sink 204 is disposed over heat source 208. Each heat sink has a centralized base plate (210, 212) with fins extending from opposite sides of the centralized base plate. The double-sided array of fins for heat sink 202 is represented by fins 221 through 224, and the double-sided array of fins for heat sink 204 is represented by fins 225 through 228. In an embodiment of the present invention, the double-sided fins disposed on a centralized base plate (e.g., 210) provide efficient heat transport through the base plate, and through fins that extend along a flow length of the base plate for maximum heat transfer. As indicated by the arrows for heat sinks 202 and 204, the heat path starts from the heat source and extends to all the fins. As described in greater detail below, alternative embodiments for heat sinks 202 and 204 may have a network of heat pipes embedded within the base plate to further increase the dissipation of heat through the heat sink. FIG. 2 illustrates the use of two heat sinks for a dual-processor system, although embodiments of a heat sink described herein may be utilized with any number of CPUs that are part of a computer system.

Figure 3A:
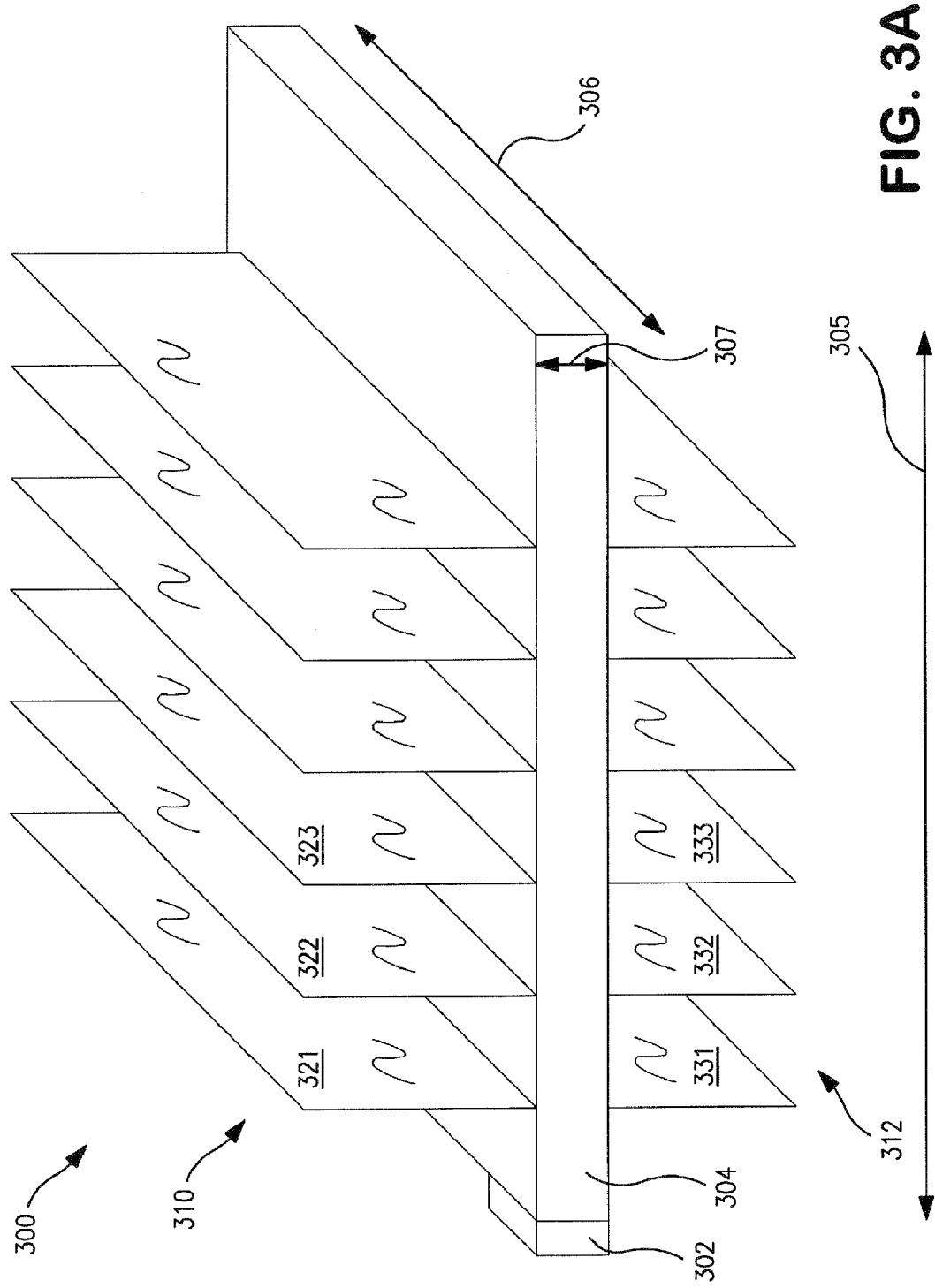
FIG. 3A illustrates a perspective view of an embodiment of a heat sink.

FIGS. 3A-3D illustrate various views of an embodiment of the present invention. FIG. 3A illustrates a perspective view of heat sink 300 having base plate portion 304 with fin arrays 310 and 312 disposed on opposite sides of base plate 304. Spreader plate 302 may be disposed near one end of base plate 304. Spreader plate 302 may also be referred to herein as a "slug" or "heat spreader." Spreader plate 302 is designed to conduct the heat produced by a heat-producing element to heat sink 300. In an embodiment of the present invention, spreader plate 302 may be made of copper. In another embodiment, spreader plate 302 is constructed from a diamond copper composite described below. Spreader plates are known in the art; accordingly, a detailed description is not provided herein.

Figure 3C:
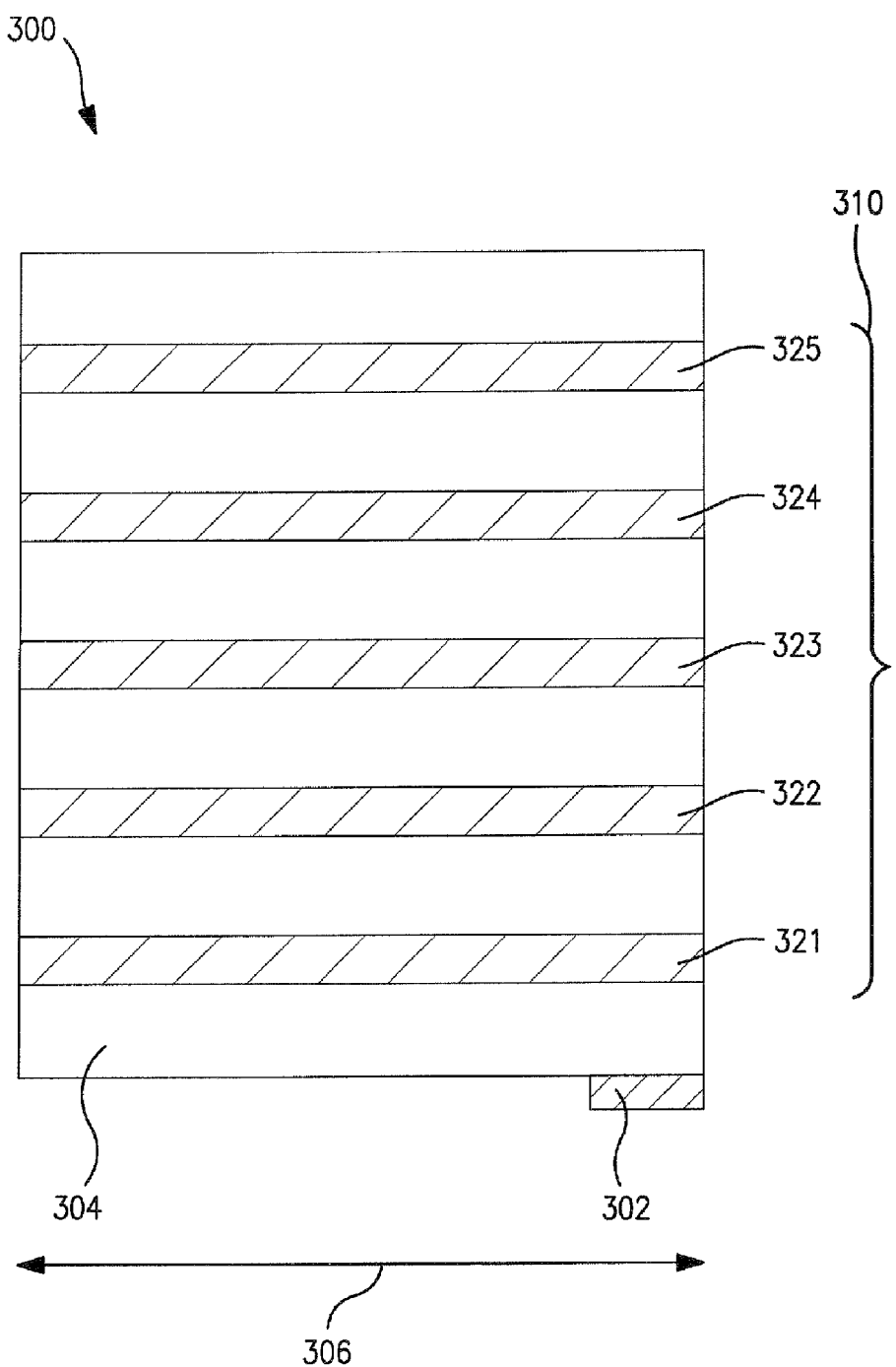
FIG. 3C illustrates a top view of an embodiment of a heat sink.
Figure 3D:
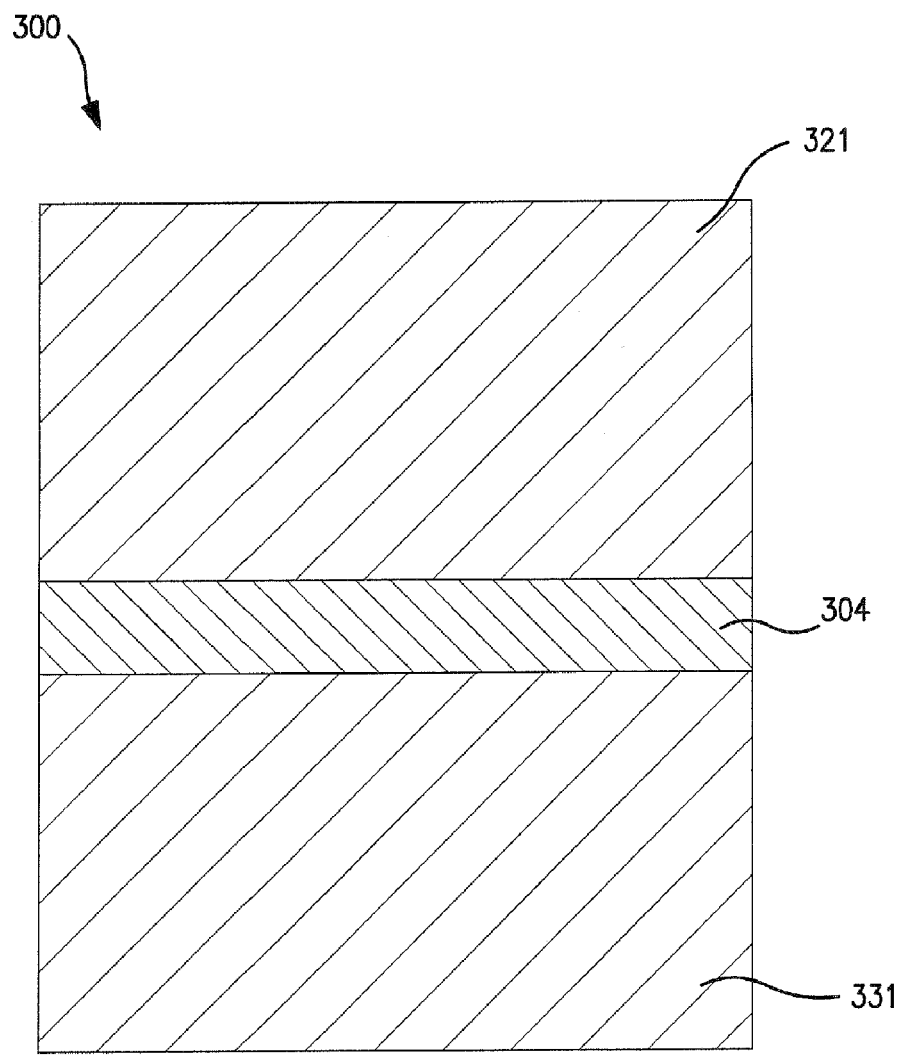
FIG. 3D illustrates a side view of an embodiment of a heat sink.

In an embodiment of the present invention, base plate 304 may be substantially rectangular in shape, with base plate 304 having a width 305, a heat flow length 306, and a thickness 307. The perspective view of FIG. 3A and the front view of FIG. 3B illustrate heat sink 300 with an array of fins (e.g., 310, 312) disposed on opposite sides of base plate 304. The group of fins 310 represented by fins 321, 322, and 323 are coupled to base plate 304 in an orientation that is substantially perpendicular to base plate 304. In an embodiment of the present invention, the fins may be disposed perpendicularly in a series along an entire width 305 of the base plate 304. As illustrated by FIG. 3C, which shows a top view of heat sink 300, each fin (321-325) may have a heat flow length substantially similar to the flow length 306 of base plate 304. FIG. 3D illustrates a side view of heat sink 300 with fins 321, 331 disposed on opposite sides of base plate 304. In an embodiment of the present invention, fins 321, 331 may be substantially the same size and shape. With respect to FIGS. 3A-3D, heat sink 300 may be oriented such that spreader plate 302 is coupled to a heat source such as CPU. In this orientation, heat sink 300 extends perpendicularly from the CPU disposed on a motherboard, with the fins oriented parallel to the motherboard and the CPU (similar to heat sinks 202, 204 of FIG. 2).

In an embodiment of the present invention, base plate 304 and fins 310, 312 may be made of a high-heat conducting material such as aluminum or copper. In an alternative embodiment, base plate 304 may be made of pyrolytic graphite alone or in combination with aluminum and/or copper. Pyrolytic graphite is a form of graphite manufactured by decomposition of a hydrocarbon gas at very high temperature resulting in an extremely anisotropic material. Pyrolytic graphite has a high conductivity in the axial direction (i.e., perpendicular to the heat generating source as illustrated in FIG. 2) making it a suitable material for base plate 304.

Figure 4:
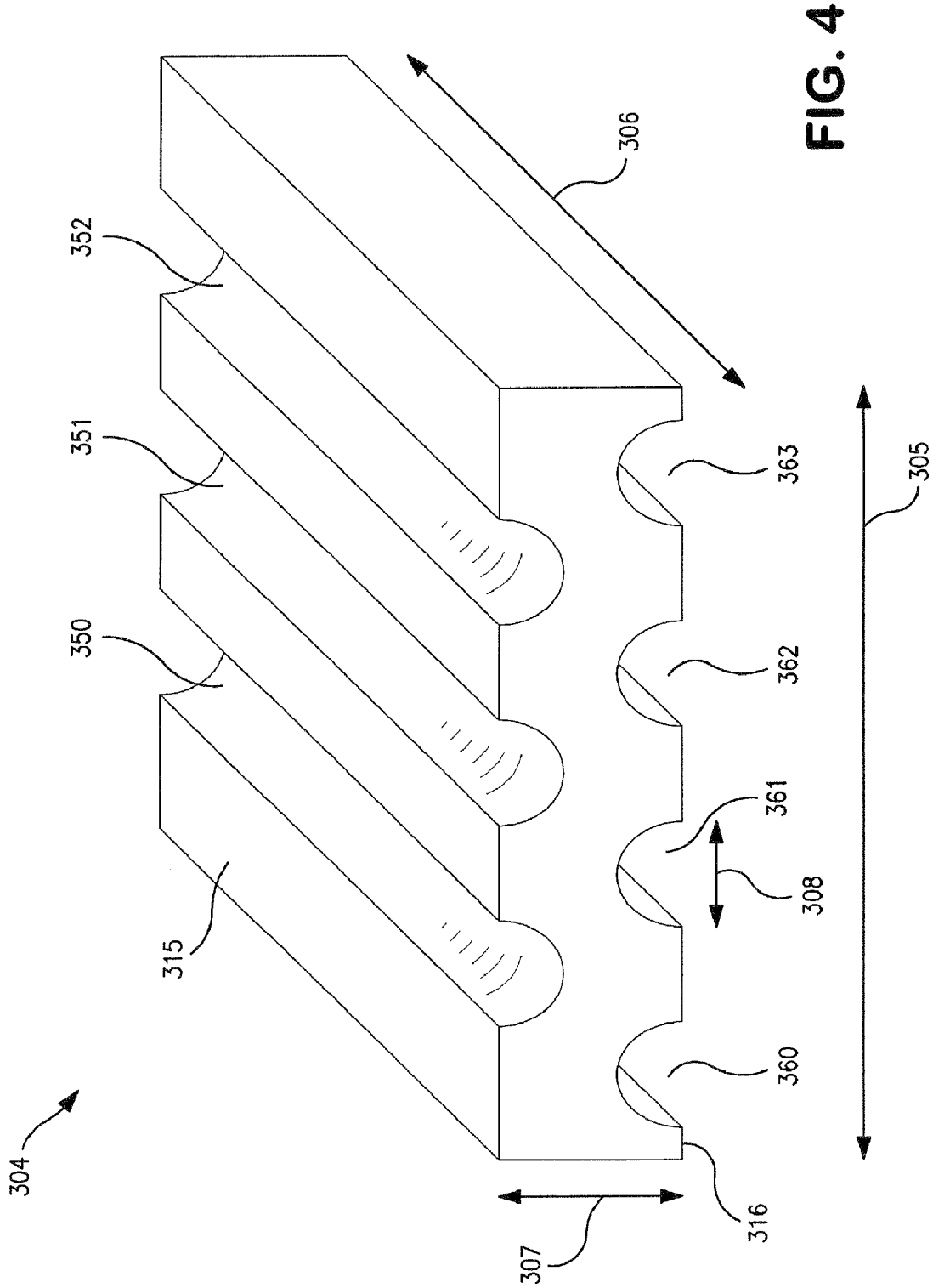
FIG. 4 illustrates an embodiment of base plate for a heat sink.

FIG. 4 illustrates an enlarged view of an embodiment of base plate 304 described above with respect to FIGS. 3A-3D. Base plate 304 has one or more channels formed on top side 315 and bottom side 316. For example, top side 315 may have channels 350, 351, and 352. Bottom side 316 may have channels 360, 361, 362, and 363. The channels may extend along an entire length 306 of base plate 304. Although base plate 304 may be any size suitable to be part of a heat sink, base plate 304 may, in an embodiment, have a width 305 of 200 mm, a flow length 306 of 150 mm, and a thickness 307 of 25 mm. Each channel (e.g., 350, 360) may have a diameter of 6-8 mm. As described in greater detail below, each channel may be compatible for housing or coupling to a heat pipe, a fin, or other heat pipe element.

Figure 5A:
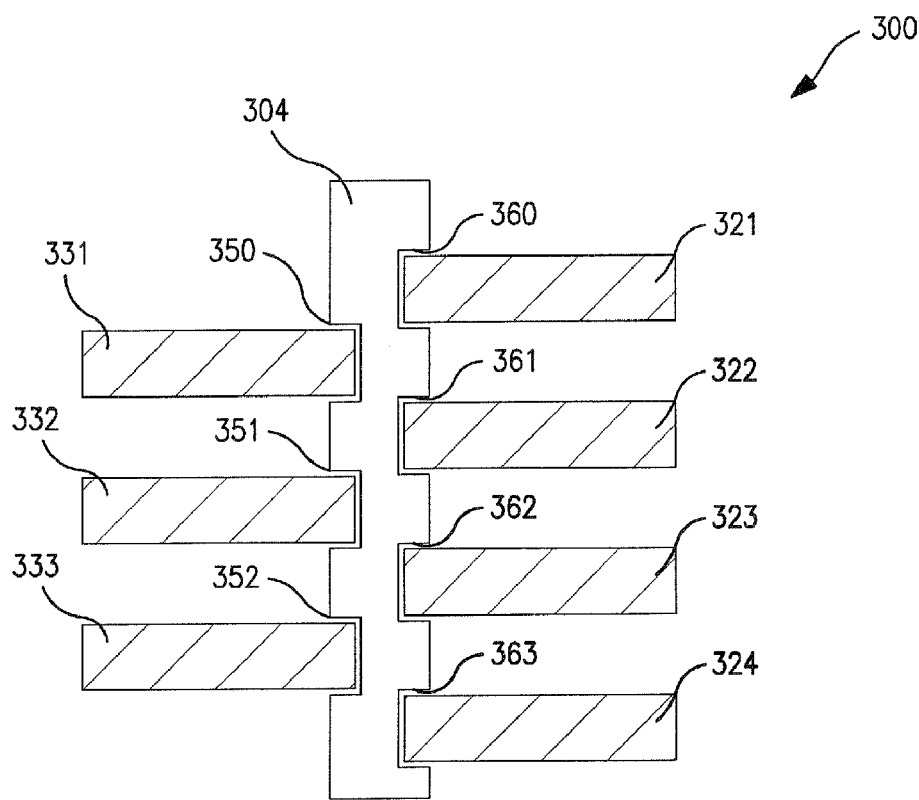
FIG. 5A illustrates a top view of a base plate with fins attached on either side.
Figure 5B:
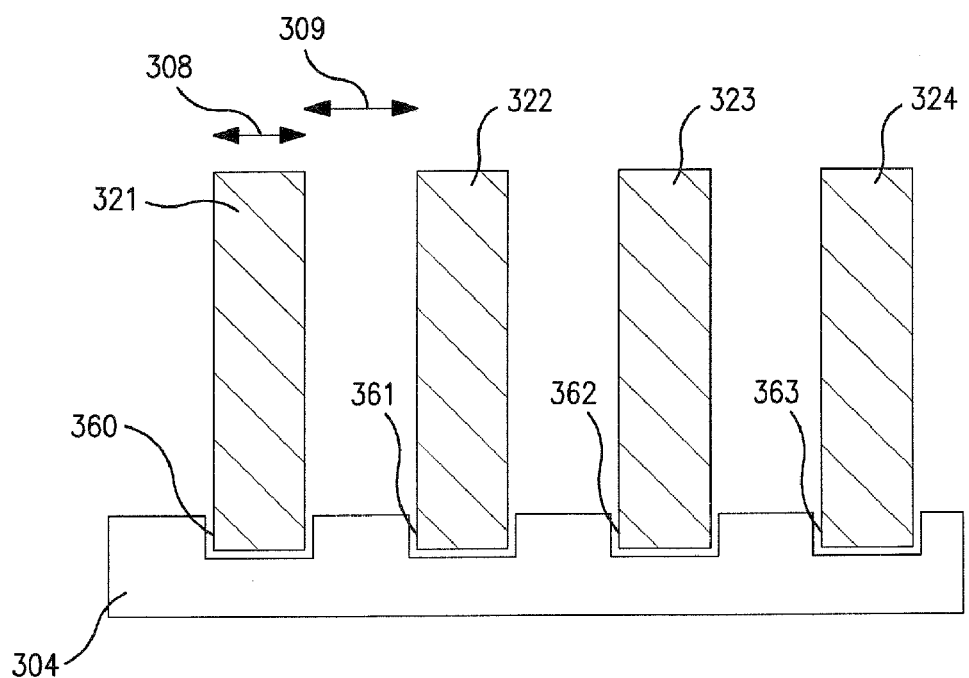
FIG. 5B illustrates an enlarged side-view of fins coupled to one side of a base plate.

FIGS. 5A-5B illustrate an embodiment of an array of fins coupled to base plate 304 described above with respect to FIG. 4. FIG. 5A shows a top view of base plate 304 with fins attached on both sides. In the embodiment shown, the fins are staggered such that a pair of fins (e.g., 321, 331) coupled to base plate 304 are not directly opposite of each other. For example, one side of base plate 304 has fins 321, 322, 323, and 324. The opposite side of base plate 304 has fins 331, 332, and 333. In an alternative embodiment, two fins on opposite sides of each other may be directly aligned with each other (as shown in FIG. 3B). Each fin is coupled to base plate 304 near the channels described above with respect to FIG. 4. For example, fin 321 is coupled to base plate 304 near channel 360, and fin 331 is coupled to base plate 304 near channel 350.

FIG. 5B shows an enlarged side-view of fins coupled to one side of base plate 304. As discussed above, each channel formed within base plate 304 is configured to be compatible with one end of a fin. For example, fin 321 has an end that fits into channel 360. In an embodiment of the present invention, each fin may have thickness 308 of up to 1 mm and gap 309 between each fin of up to 2 mm. Up to 70 fins may be disposed on each side of base plate 304 for a total of up to 140 fins. In an embodiment of the present invention, fin 321 may be coupled to base plate 304 by crimping one end of fin 321 into channel 360. In an alternative embodiment, one end of fin 321 may be soldered into channel 360. Methods to couple fins to a base plate are known in the art; accordingly, a detailed description is not provided herein.

Figure 6:
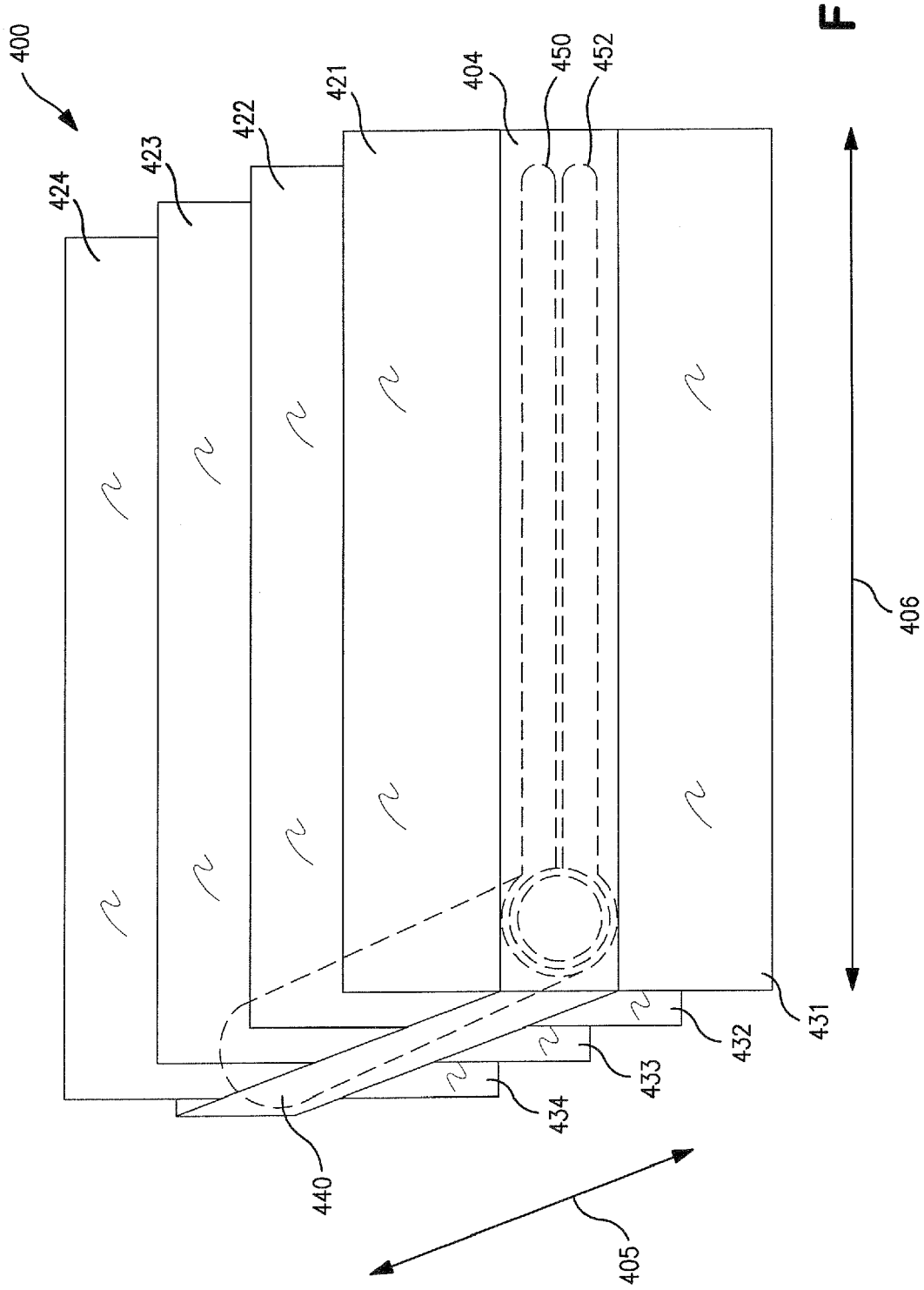
FIG. 6 illustrates a partial see-through view of an embodiment of a heat sink having a base plate with fins coupled to both sides.

FIG. 6 illustrates a partial see-through view of an embodiment of a heat sink 400 having fins (e.g., fins 421-424 and 431-434) coupled to opposite sides of base plate 404. One or more heat pipes may be embedded within base plate 404. For example, main heat pipe 440 may be disposed within base plate 404 along width 405. Additional heat pipes (e.g., pipes 450, 452) may be disposed within base plate 404 along flow length 406 with respect to opposing pairs of fins (e.g., fins 421 and 431). Main heat pipe 440 is disposed near one side of base plate 404, and auxiliary heat pipes 450, 452 are oriented perpendicular to main heat pipe 440 and aligned with opposing fins 421, 431. In an embodiment of the present invention, heat sink 400 is attached to a heat source (e.g., a CPU) such that one end of main heat pipe 440 is oriented directly above the heat source. The heat dissipates through width 405 of main pipe 440 and along flow length 406 of each auxiliary heat pipe and out the fins. As discussed in greater detail below, auxiliary heat pipes 450, 452 have combined diameters that are similar to the diameter of main heat pipe 440.

For clarity of description, this particular view of heat sink 400 shows two auxiliary heat pipes 450,452 in addition to main heat pipe 440. However, an auxiliary heat pipe exists for every fin attached to base plate 404. In alternative embodiments of the present invention, any number of auxiliary heat pipes may be disposed within base plate 404. The combination of heat pipes embedded within base plate 404 and fins coupled to both sides of base plate 404 increases the efficiency of heat dissipation throughout entire width 405 and flow length 406 of base plate 404 and the fins.

Figure 7A:
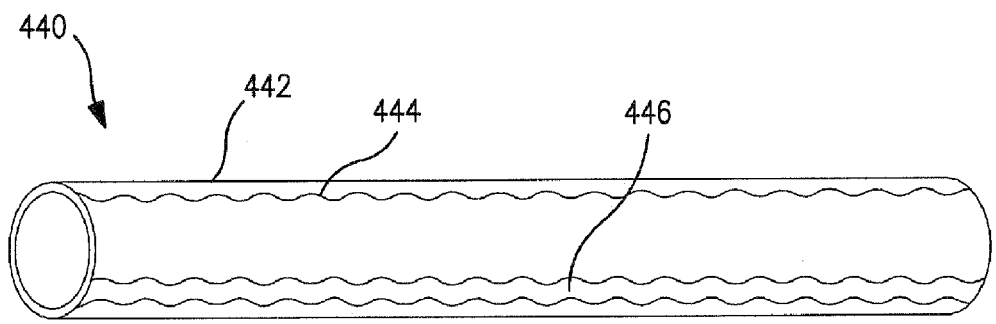
FIG. 7A illustrates a side view of the heat pipe shown in FIG. 6.
Figure 7B:
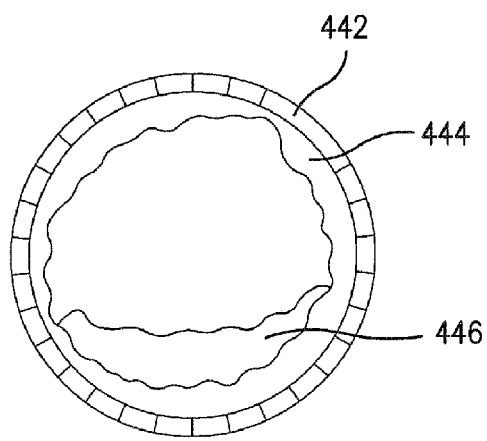
FIG. 7B illustrates a cross-sectional view of the heat pipe shown in FIG. 6.

FIGS. 7A and 7B illustrate isolated views of heat pipe 440 described above with respect to FIG. 6. In an embodiment of the present invention, the following description of heat pipe 440 may be analogous or applicable to auxiliary heat pipes 450,452. Heat pipes are typically cylindrical structures containing water. As heat is absorbed within the cylinder, the water boils to a vapor phase and passes through a wick structure lining an inner surface of the pipe. The heat is then released into an outer portion of the cylinder wall and the vapor condenses back into liquid form. Gravity and the condensation of liquid along the wick return the liquid to a lower portion of the cylinder. Heat pipes are well-known in the art; accordingly, a detailed description is not provided herein.

FIG. 7A shows a side view of heat pipe 440 having outer wall 442, wick 444 disposed along an inside of wall 442 and cooling material 446 (e.g., H2O) disposed within an inner lumen of heat pipe 440. FIG. 7B shows a cross-sectional view of heat pipe 440 showing the relationship of wall 442, wick 444, and cooling material 446. H2O and low melt-alloys are just a few examples of a cooling material 446 that may be used with heat pipe 440. Other materials or liquids for cooling material 446 are known in the art; accordingly, a detailed description is not provided herein. As heat passes through heat pipe 440, liquid 446 vaporizes into wick 444 and through wall 442, subsequently spreading out through the fins.

Figure 8:
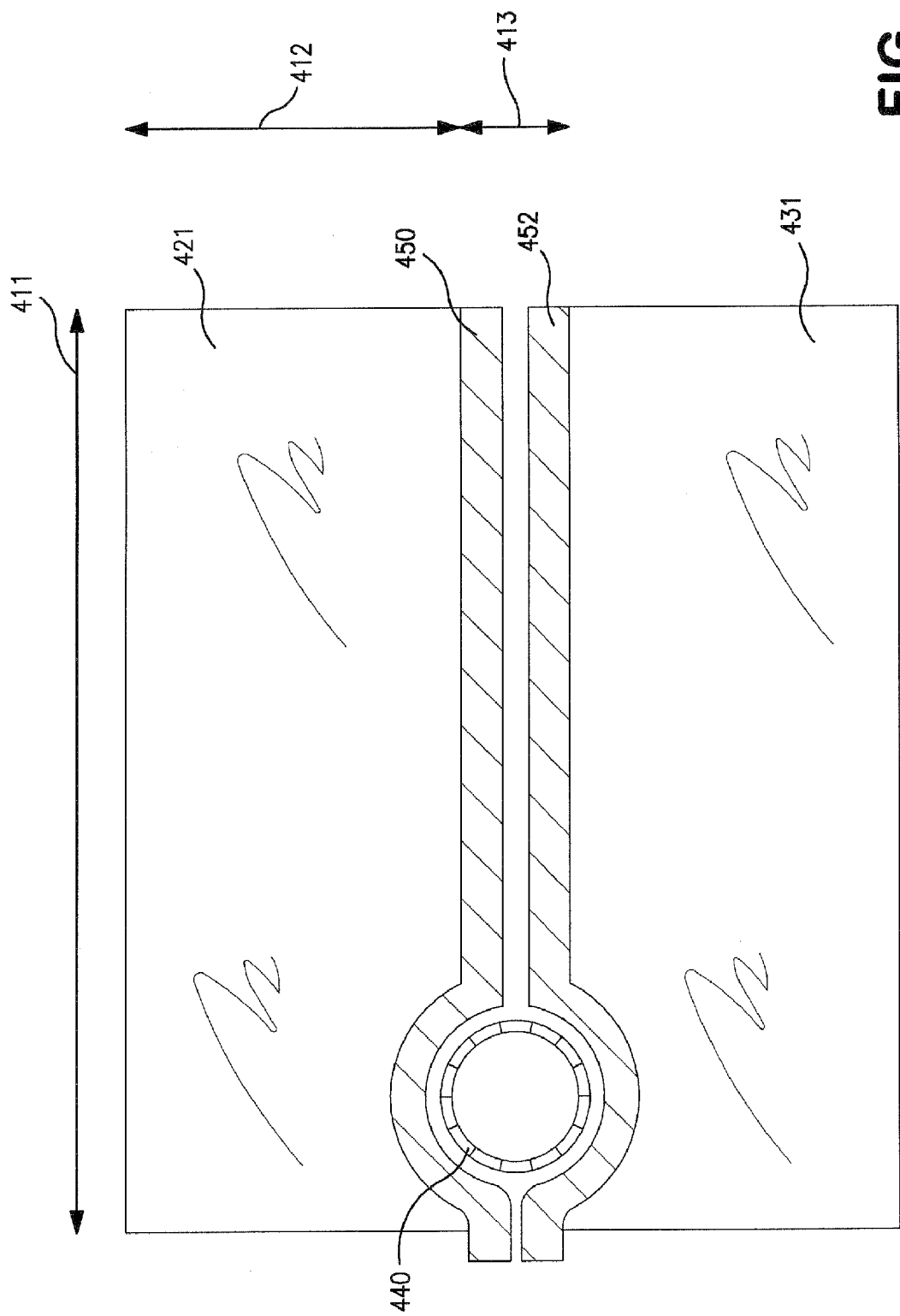
FIG. 8 illustrates a cross-sectional view of the heat sink shown in FIG. 6.

FIG. 8 illustrates a cross-sectional view of heat sink 400 shown in FIG. 6 through a flow length (e.g., 406) of fin 421, auxiliary heat pipes 450, 452, and fin 431. This cross-section of base plate 404 shows, in an embodiment, the orientation of main heat pipe 440 and auxiliary heat pipes 450, 452, with main heat pipe 440 disposed near one side of the base plate (not shown). The cylindrical structures of main heat pipe 440 and auxiliary heat pipes 450,452 have closed ends. Auxiliary heat pipes are separated by a fixed distance from each other throughout a flow length with ends that partially wrap around main heat pipe 440. This structural configuration of auxiliary heat pipes with respect to main heat pipe 440 allows heat to be transferred efficiently from main heat pipe to an entire flow length of each auxiliary heat pipe. As discussed above, fins 421, 431 have flow length 411 and flow height 412 corresponding to the dimensional length and width of each fin. Main heat pipe has diameter 413 that may be substantially similar to the combined diameters of auxiliary heat pipes 450,452.

In an embodiment of the present invention, heat fins 421 and 431 are substantially similar in size and shape having flow length 411 of up to 300 mm, and flow height 412 of up to 75 mm. Main heat pipe 440 may have diameter 413 of up to 30 mm. In an alternative embodiment, heat fins 421, 431 and main heat pipe 440 may have other dimensions.

Figure 9A:
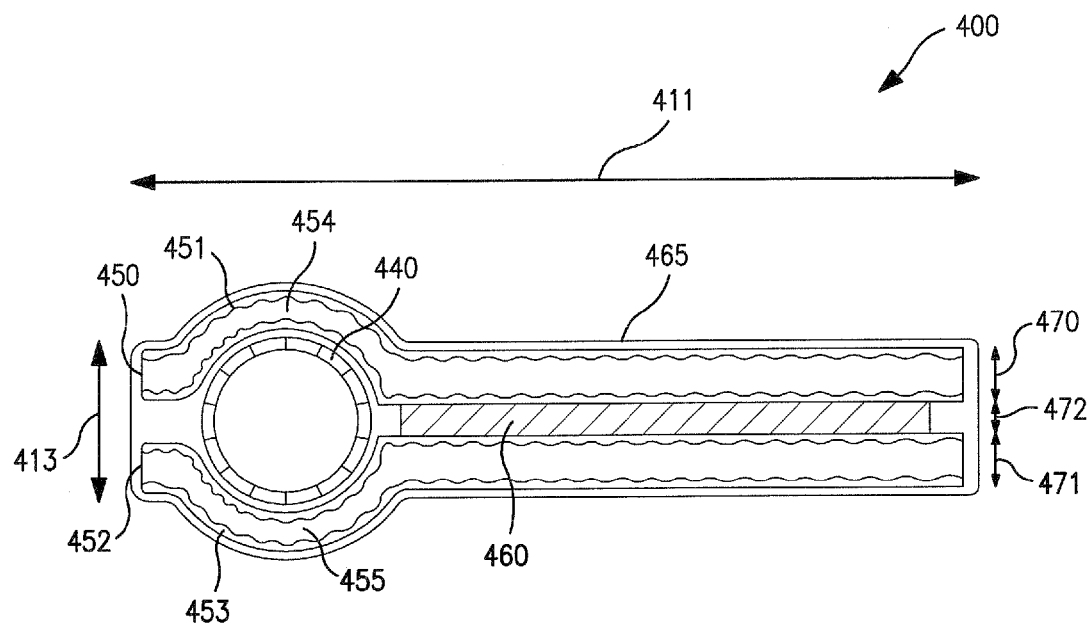
FIG. 9A illustrates an enlarged cross-sectional view of a main heat pipe and auxiliary heat pipes.

FIG. 9A illustrates an enlarged cross-sectional view of heat sink 400 through main heat pipe 440 and auxiliary heat pipes 450,452, but without fins 421, 431. One end portion of each auxiliary heat pipe 450, 452 wraps partially around main heat pipe 440. Each auxiliary heat pipe has a diameter that is less than the diameter of main heat pipe 440 and includes wick structures 451, 453 that form channels 454, 455. The heat pipes are held together by wrap-around plate 465 that covers the outer dimensions of auxiliary heat pipes 450, 452. In an embodiment of the present invention, wrap-around plate 465 may be the base plate discussed herein (e.g., base plates 304, 404). Wrap-around plate 465 is made of a heat conducting material such as aluminum or copper.

In an embodiment of the present invention, main heat pipe 440 may have diameter 414 of 25 mm and auxiliary heat pipe 450 may have diameters 470, 471 of up to 10 mm. Combined length 411 (i.e., heat flow length) of main heat pipe 440 and auxiliary heat pipes 450, 452 as shown in this cross-section may be approximately 200 mm. Auxiliary heat pipes 450, 452 are separated by a distance 472, and in an embodiment, may be separated by heat-conducting spacer 460 having a thickness of up to 6 mm. In an alternative embodiment of the present invention, heat-conducting spacer 460 may be an aluminum heat spreader.

Figure 9B:
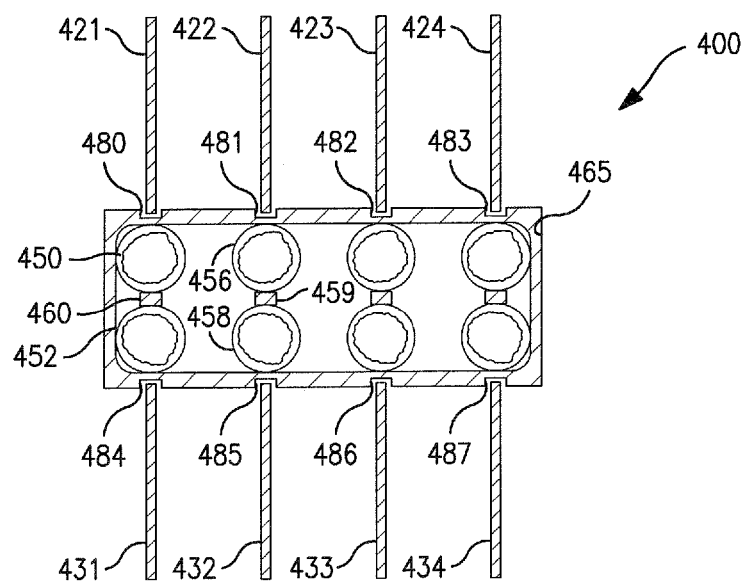
FIG. 9B illustrates another enlarged cross-sectional view of a main heat pipe and auxiliary heat pipes.

FIG. 9B illustrates a cross-sectional view of heat sink 400 that is perpendicular to the flow length cross-sectional view shown with respect to FIG. 9A. Four pairs of auxiliary heat pipes are covered by wrap-around plate 465. Auxiliary heat pipes are represented by reference numerals 450, 452, 456, and 458. Each pair of auxiliary heat pipes are separated by a heat spreader (e.g., 459, 460). Fins 421-424 are attached to one side of wrap-around plate 465 and fins 431-434 are attached to the opposite side of wrap-around plate 465. Grooves or channels 480-483 are formed on an outer surface of wrap-around plate 465 for fins 421-424 and channels 484-487 are formed for fins 431-434. In an alternative embodiment, channels 480-483 and 484-487 may be similar to channels 350-352 and 360-363 described above with respect to FIG. 4.

Figure 10:
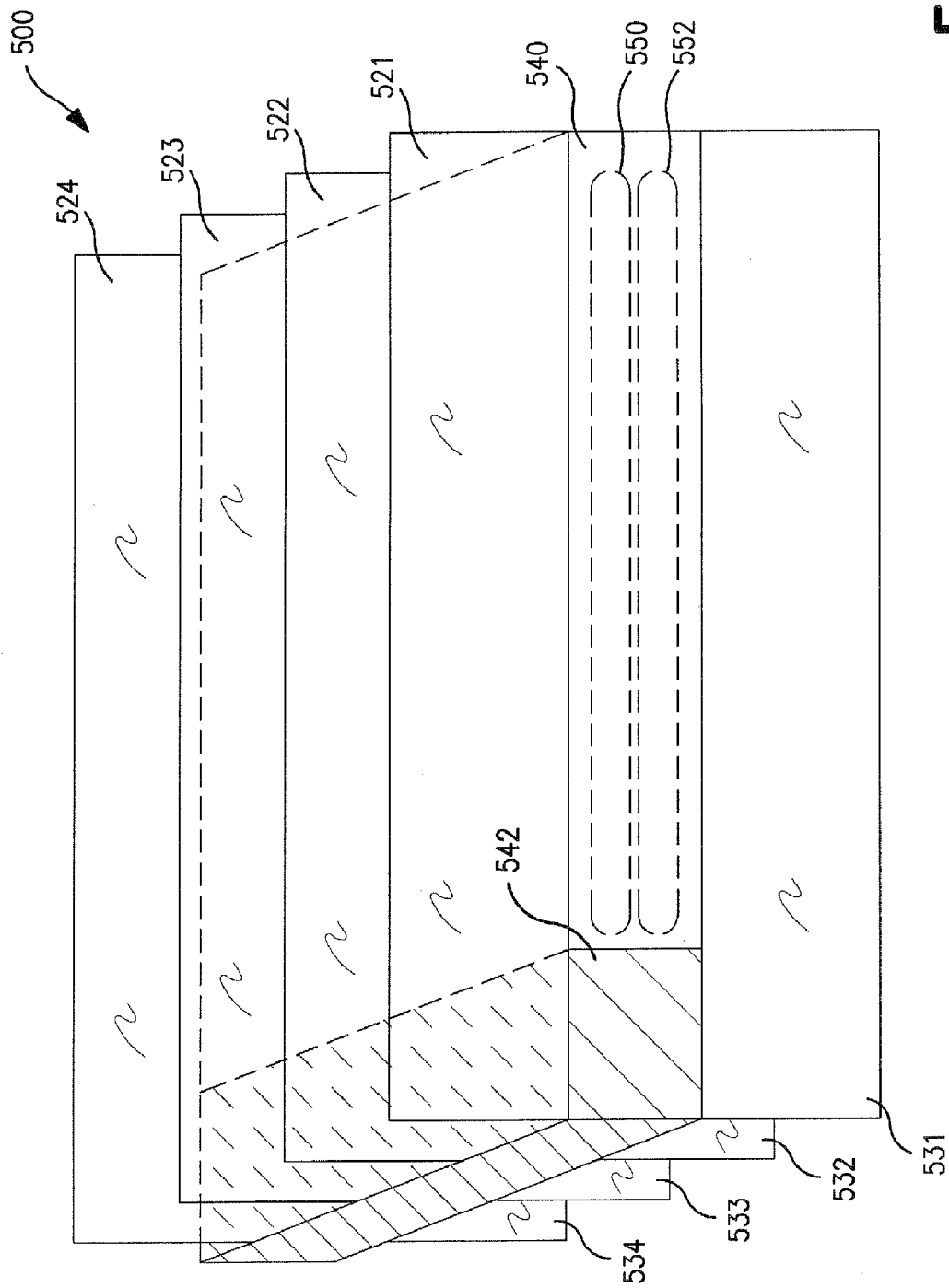
FIG. 10 illustrates an alternative embodiment of a heat sink.

As discussed above, the base plate or the wrap-around plate is made of a high heat-conducting material such as aluminum or copper. In an alternative embodiment of the present invention, the base plate may be made of multiple materials that provide an advantage over a single, uniform material. FIG. 10 illustrates an alternative embodiment of heat sink 500 having fins 521-524 and 531-534 disposed on opposite sides of base plate 540. Portion 542 of base plate 540 is made of pyrolytic graphite while the remainder of base plate 540 is made of a different heat conducting material such as aluminum or copper. Portion 542 of base plate 540 may be extruded during the base plate manufacturing process to produce this combination. Base plate 540 may also include multiple auxiliary heat pipes 550, 552 to help dissipate the heat along the flow length of base plate 540 and to the double-sided fins. Auxiliary heat pipes may be embedded within base plate 540 for every fin coupled to base plate 540. In an alternative embodiment of heat sink 500, auxiliary heat pipes may not be necessary. Because pyrolytic graphite has a high conductivity in the axial direction, portion 542 may be disposed directly over a heat source (e.g., a CPU), thereby allowing the heat to dissipate to all the fins along the heat flow length that is perpendicular to portion 542. Heat sink 500 may have a network of heat pipes (e.g., a main heat pipe and auxiliary heat pipes discussed above with respect to FIGS. 6-9B).

Figure 11:
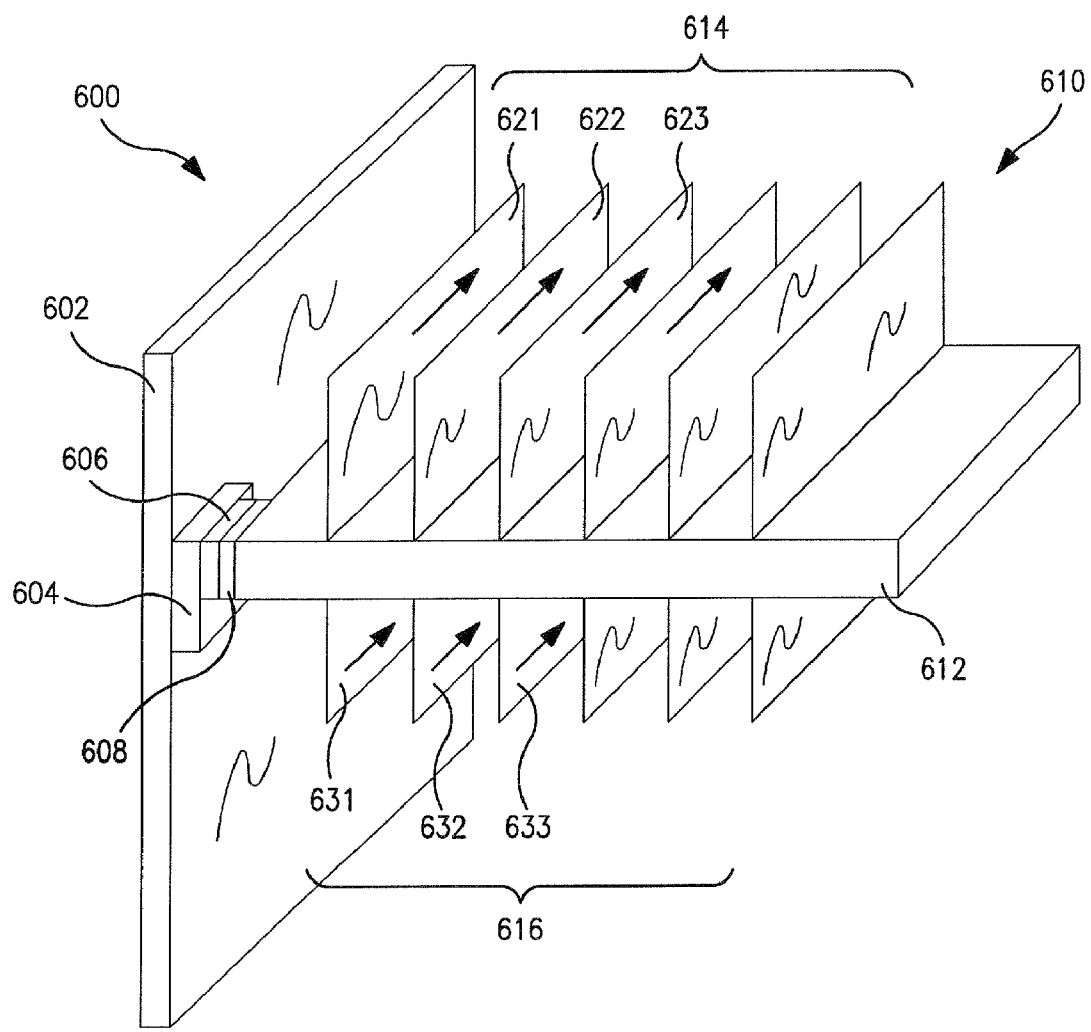
FIG. 11 illustrates an embodiment of a computer assembly having a cooling system.

FIG. 11 illustrates an embodiment of computer assembly 600 having a cooling system. In particular, cooling system 610 dissipates heat generated by a CPU disposed on a motherboard. FIG. 11 illustrates an internal view of the computer chassis with motherboard 602 in a vertical position. A substrate 604 (e.g., a silicon substrate) is disposed on motherboard 602. Heat-generating CPU 606 is disposed above substrate 604. Heat-spreading element or slug 608 is disposed above CPU 606. As discussed above, heat spreader 608, in an embodiment, may be made of a heat-conducting material such as copper that spreads heat from CPU 606 to heat sink 610. In an embodiment, heat spreader slug 608 is constructed from a diamond copper composite described below. Heat sink 610 is disposed above slug 608 with base plate portion 612 extending perpendicularly from motherboard 602. It should be noted that the computer assembly illustrated in FIG. 11 is not necessarily drawn to scale. In particular, heat sink 610 has been enlarged to provide a better understanding of its structure and orientation.

Multiple fins 614 and 616 are disposed on both sides of base plate 612. Fins 621, 622, and 623 are representative of fins disposed on one side of base plate 610, and fins 631, 632, and 633 are representative of fins disposed on the opposite side of base plate 612. Any number of fins may be disposed on both sides of base plate 612 and is not limited to the number a fins illustrated with respect to FIG. 11. One or more heat pipes (not shown) may be embedded within base plate 612, as discussed above with respect to FIGS. 6, 7A, and 7B. For example, a main heat pipe (not shown) may be disposed along a width of base plate in addition to one or more auxiliary heat pipes (not shown) extending along a flow length of base plate 612 between opposing fins (e.g., fins 621 and 631). Base plate 612 is coupled to heat spreader 608 near a corner portion of base plate 612. This relative position of base plate 612 to heat spreader 608 allows the heat generated by CPU to spread efficiently throughout heat sink 610. In an embodiment of the present invention, the main heat pipe may be embedded within base plate 612 such that it aligns over heat spreader 608 and CPU 606. A cooling fan (also not shown) may be disposed near heat sink 610 to force air through the fins of heat sink 610 in the direction indicated by arrows 640. As such, in an embodiment, heat dissipates from CPU 606 efficiently towards the outer dimensions of all the fins disposed on both sides of base plate 612.

Figure 11A:
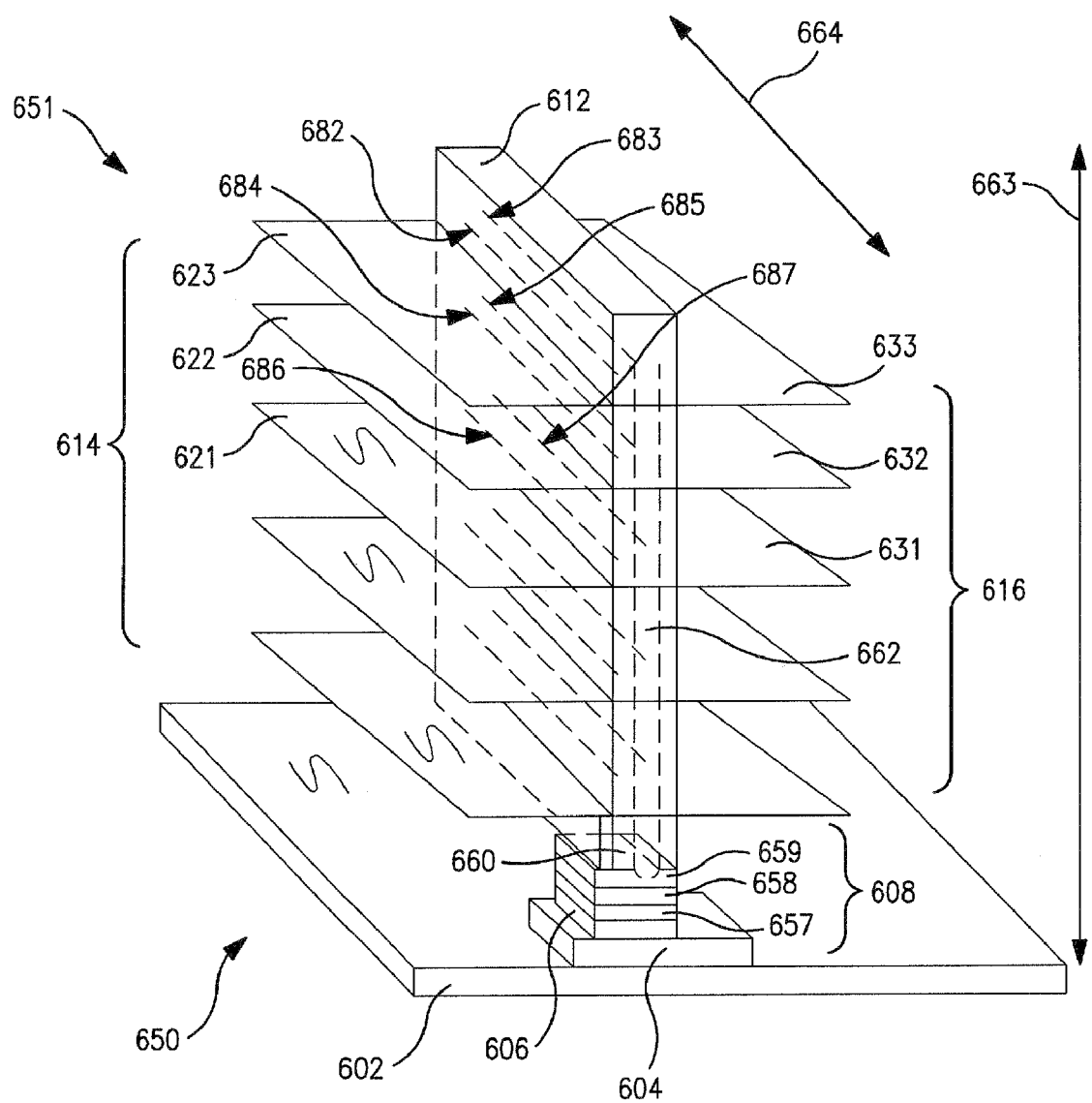
FIG. 11A illustrates an alternative embodiment of a computer assembly having a heat sink comprising a diamond-copper composite heat spreader.

FIG. 11A illustrates an alternate embodiment of computer assembly 650 having a cooling system 651. In particular, cooling system 651 comprises a diamond-copper composite heat spreader 660. FIG. 11A illustrates an internal view of the computer chassis similar to one described in FIG. 11 above. A substrate 604 (e.g., a silicon substrate) is disposed on motherboard 602. Heat-generating CPU 606 is disposed above substrate 604. Heat-spreading element or slug 608 is disposed above CPU 606. Heat spreader 608, in an embodiment, may be made of a heat-conducting material such as copper that spreads heat from CPU 606 to heat sink 610. In an embodiment, heat spreader slug 608 is constructed from a diamond copper composite described below. The core layer 658 of the heat spreader 608 comprises a diamond copper composite material that is composed of 93% compressed diamond dust, and 7% compressed copper, while the two outer facing surfaces of the composite layer 658 are fused between pure copper skins, 657 and 659 creating a solid composite sandwich heat spreader 608. Outer skins 657 and 659 can be designed to a wide variety of thicknesses and shapes to allow machined grooves for round or flattened heat pipes. Also, in an embodiment, heat spreader slug 608 may contain channels such as channel 660 in the surface layer 659 of heat spreader slug, which can be dimensioned to receive heat pipe 662. In an embodiment, the depth of channel 660 is approximately the radius of the heat pipe it receives. The thermal interface may be a grease or gel, and may contain a boron nitride material having particle sizes of less than one micron.

Heat sink 651 is disposed above slug 608 with base plate portion 612 extending perpendicularly from motherboard 602. It should be noted that the computer assembly illustrated in FIG. 11A is not necessarily drawn to scale. In particular, heat sink 610 has been enlarged to provide a better understanding of its structure and orientation.

FIG. 11A shows multiple fins 614 and 616 that are disposed on both sides of base plate 612. Fins 621, 622, and 623 are representative of fins disposed on one side of base plate 610, and fins 631, 632, and 633 are representative of fins disposed on the opposite side of base plate 612. Any number of fins may be disposed on both sides of base plate 612 and is not limited to the number a fins illustrated with respect to FIG. 11A.

One or more heat pipes may be embedded within base plate 612. For example, main heat pipe 662 may be disposed within base plate 612 along width 663. Additional heat pipes (e.g., pipes 682, 683) may be disposed within base plate 612 along flow length 664 with respect to opposing pairs of fins (e.g., fins 623 and 633). Main heat pipe 662 is disposed near one side of base plate 612, and auxiliary heat pipes 682, 683 are oriented perpendicular to main heat pipe 664 and aligned with opposing fins 623, 633. Base plate 612 is coupled to heat spreader 608 near a corner portion of base plate 612. In an embodiment of the present invention, heat sink 651 is attached to a heat source (e.g., a CPU) such that one end of main heat pipe 662 is oriented directly above the heat source. The heat dissipates through width 663 of main pipe 662 and along flow length 664 of each auxiliary heat pipe and out the fins. As discussed in greater detail below, auxiliary heat pipes 682-683 have combined diameters that are similar to the diameter of main heat pipe 662.

Figure 12:
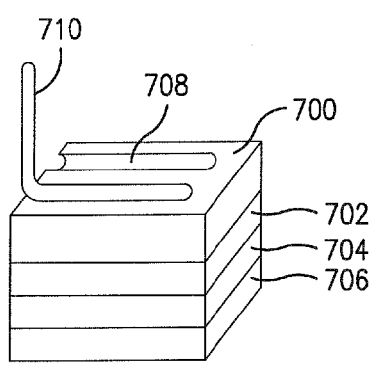
FIG. 12 illustrates a diamond-copper composite slug heat sink baseplate.

Directing attention to FIG. 12, in an alternative embodiment, the axial channel described can be improved by alleviating heat flux bottlenecks at the heat sink slug, heat pipe wall, and heat pipe wick. In this embodiment, DiaCu is utilized as composite heat spreader slug 700 at the base of the heat sink to spread heat from the die into a bigger sink region, thus quickly decreasing the overall flux into standard heat pipes or cooling channels. The following description of heat spreader slug 700 can also be implemented in an alternative embodiment of heat spreader 608 described above. The diamond copper composite is composed of 93% compressed diamond dust, and 7% compressed copper, while the two outer facing surfaces of the composite are fused between pure copper skins, creating a solid composite sandwich. Pure diamond has a thermal conductivity around 1500 W/mK, but the middle of the sandwich is about 1000 W/mK. Outer copper skins have the thermal conductivity of standard copper at 390 W/mK. Outer skins can be designed to a wide variety of thicknesses and shapes to allow machined grooves for round or flattened heat pipes. As illustrated, heat spreader slug 700 is separated by thermal interface layer 702 from silicon layer 704 and ceramic layer 706. Also, in an embodiment, heat spreader slug 700 may contain channels such as channel 708 in the surface of heat spreader slug, which can be dimensioned to receive heat pipe 710. In an embodiment, the depth of channel 708 is approximately the radius of the heat pipe it receives. The thermal interface may be a grease or gel, and may contain a boron nitride material having particle sizes of less than one micron.

An embodiment of the present invention incorporates a cavity above the die's hot spot for pure diamond film. Preferably, the targeted area is approximately 3 mm by 3 mm, but other configurations can be used. In an embodiment, about 40 mm of heat pipe length is embedded in the slug for ideal heat transfer. Several 6 mm or 8 mm diameter heat pipes can be used, but the number of heat pipes for any given design is determined by power, operating temperature, available area, pipe diameter, pipe shape, pipe radius, and pipe length. It is also possible to solder a 1" pipe to the slug in applications utilizing the larger pipe described above.

Figure 13:
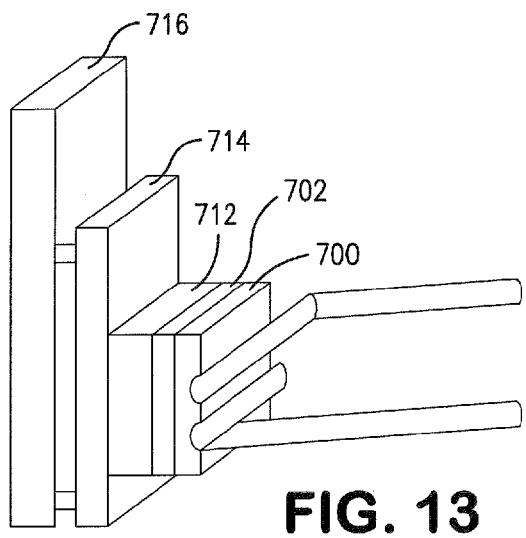
FIG. 13 illustrates a diamond slug heat sink baseplate used in a tower chassis application.

Heat spreader slug 700 may also be used in tower chassis applications. As shown in FIG. 13, heat spreader slug 700 is disposed in a vertical configuration, separated again by thermal interface layer 702 from chip 712 and stacked boards 714, 716.

On the outer skin facing the heat sink (not die side), about 4.25 mm of copper can be added which enables two to four axial grooves for 4.0 mm deep channels that can accept 8 mm diameter heat pipes. Likewise, for a 6 mm pipe implementation, the dimensions of the copper skin can be reduced to 3.25 mm thickness with 3.0 mm axial groove channels. If circular grooves cannot be included for pipe attachment due to mechanical constraints, then flattened pipes can be directly soldered, but this defeats the purpose of an idealized round heat pipe in an integrated slug, as round pipes perform better than flattened pipes. Either a disc or rectangle can be implemented without adverse effects as long as the slug-to-die-area ratio is increased by a factor of 5× to 20× above the die.

Heat pipe length is limited by current manufacturing processes for DiaCu and the physical vapor properties associated with industry standard heatpipes for any given pipe diameter. For standard heat pipe walls that are 0.3 mm thick copper, this composite structure provides an improved heat pipe. Preferred implementations of the present invention include low-profile heat pipes where bending is not required over a large length. Good dimensions are 0.25 mm (outer copper skin with DiaCu process)+<1.0 mm (composite DiaCu)+0.25 mm (inner copper skin of DiaCu for axial wick grooves or porous sintered copper).

A wide variety of thermal interface materials can be used between the die and the disc. Copper-to-copper attach can be achieved through silver brazing, silver solder, and gold-tin solder. Standard solder can also be used.

Figure 14:
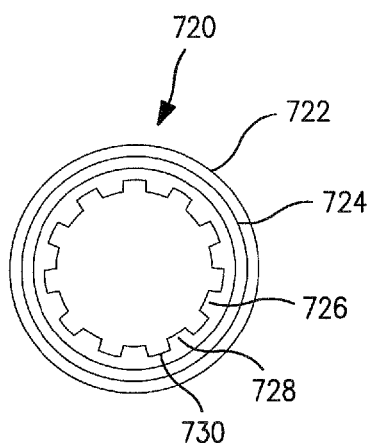
FIG. 14 illustrates a heat pipe utilizing a diamond-copper structure.

Various profile configurations are considered for the heat pipe of the present invention. Directing attention to FIG. 14, heat pipe 720 includes outer copper skin 722 that wraps around diamond-copper layer 724. In an embodiment, diamond-copper layer 724 has similar concentrations of compressed diamond and copper dust as described above for heat spreader slug 700. Wick layer 726 includes a plurality of axial grooves that run the length of heat pipe 720. In an embodiment, wick layer 726 is made from copper. Either or both of wick 728 or channel 730 can be constructed from the diamond-copper mixture described above for heat spreader slug 700.

Figure 15:
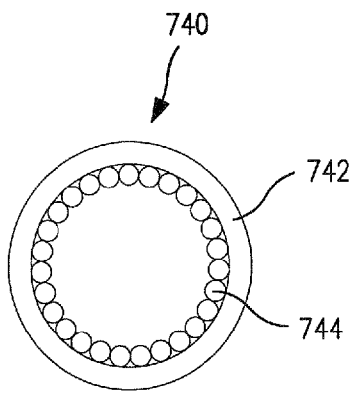
FIG. 15 illustrates an alternative embodiment of a heat pipe utilizing a diamond-copper structure.

FIG. 15 illustrates another embodiment of a heat pipe of the present invention. Heat pipe 740 can include diamond-copper tube 742, having attached to its interior face sintered diamond copper disposed between carbon fibers.

Figure 16:
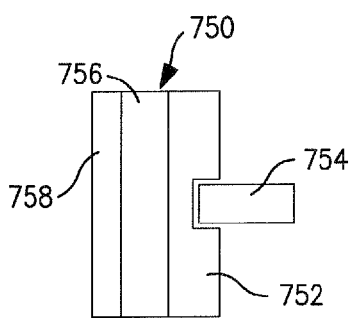
FIG. 16 illustrates a heat spreader slug disposed to receive a heat pipe according to the present invention.
Figure 17:
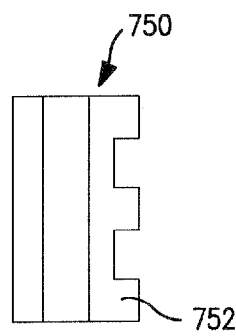
FIG. 17 illustrates an alternative embodiment of a heat spreader slug in which multiple channels can be formed in a copper layer to accommodate more than one heat pipe.
Figure 18:
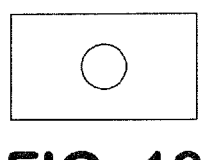
FIG. 18 illustrates a rectangular heat pipe.
Figure 20:
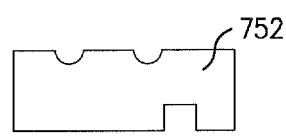
FIG. 20 illustrates a heat slug having channels configured to accommodate round heat pipes as well as rectangular heat pipes.
Figure 21:
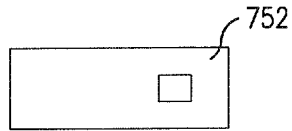
FIG. 21 illustrates a section view of a copper layer that is incorporated into a heat slug and faces the die.
Figure 19:
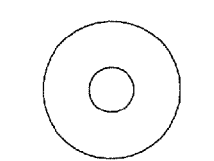
FIG. 19 illustrates a round heat pipe.

FIG. 16 illustrates a heat spreader slug disposed to receive a heat pipe according to the present invention. Heat spreader slug 750 includes copper layer 752 having a channel that receives heat pipe 754. Copper layer 752 is disposed adjacent diamond-copper layer 756, which is sandwiched between copper layer 752 and copper layer 758. FIG. 17 illustrates an alternative embodiment of heat spreader slug 750, in which multiple channels can be formed in copper layer 752 to accommodate more than one heat pipe 754. In an alternative embodiment of heat spreader slug 750, copper layer 752 can have channels to receive round heat pipes (FIG. 19) and/or rectangular heat pipes (FIG. 18). Various configurations of copper layer 752 are shown in FIGS. 20 and 21. FIG. 20 illustrates copper layer 752 machined to have channels for rounded heat pipes as well as rectangular heat pipes. FIG. 21 illustrates the side of copper layer 752 that faces the die. As illustrated, an aperture extends through the core of copper layer 752 to receive pure diamond vapor. Pure diamond is expensive and so its size is limited to the hot spot area on the silicon. Pure diamond has higher thermal conductivity than sintered diamond copper.

Figure 22:
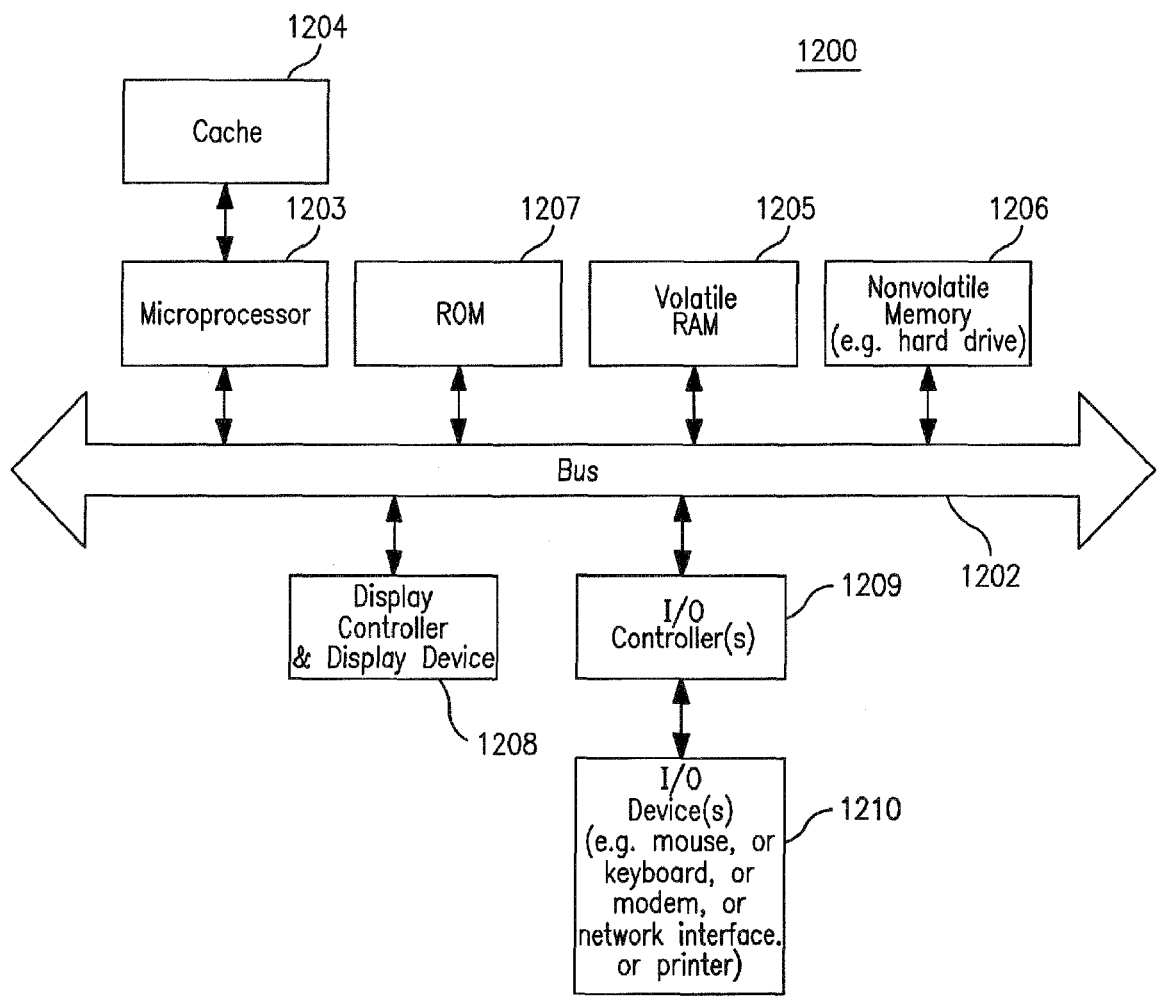
FIG. 22 illustrates a block diagram of a computer that may be used with an embodiment of the present invention.

FIG. 22 is a block diagram of a computer that may be used with an embodiment of the present invention. In an embodiment, exemplary system 1200 includes a processor having one or more arithmetic logical units ("ALUs"), a process executed by the processor from a memory. Note that while FIG. 22 illustrates various components of a computer system, it is not intended to represent any particular architecture or manner of interconnecting components, as such details are not germane to the present invention. It will also be appreciated that networked computers, handheld computers, cell phones, and other data processing systems which have fewer components or perhaps more components may also be used with the present invention.

As shown in FIG. 22, computer system 1200, which is a form of a data processing system, includes bus 1202 coupled to microprocessor 1203 and ROM 1207, volatile RAM 1205, and non-volatile memory 1206. Microprocessor 1203, is coupled to cache memory 1204 as shown in the example of FIG. 22. Bus 1202 interconnects these various components together and also interconnects components 1203,1207,1205, and 1206 to a display controller and display device 1208, as well as to input/output (I/O) devices 1210, which may be pointing devices, keyboards, modems, network interfaces, printers, and other devices that are well known in the art. Typically, input/output devices 1210 are coupled to the system through input/output controllers 1209. Volatile RAM 1205 is typically implemented as dynamic RAM (DRAM) that requires power continuously in order to refresh or maintain the data in the memory. Non-volatile memory 1206 is typically a magnetic hard drive, magnetic optical drive, optical drive, or a DVD RAM or other type of memory system that maintains data even after power is removed from the system. Typically, non-volatile memory 1206 can be implemented as a random access memory, although this is not required. While FIG. 22 shows that non-volatile memory 1206 is a local device coupled directly to the rest of the components in the data processing system, it will be appreciated that the present invention may utilize a non-volatile memory which is remote from the system, such as a network storage device that is coupled to the data processing system through a network interface such as a modem or Ethernet interface. Bus 1202 may include one or more buses connected to each other through various bridges, controllers, and/or adapters, as is well-known in the art. In an embodiment, I/O controller 1209 includes a Universal Serial Bus ("USB") adapter for controlling USB peripherals.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded in an illustrative rather than a restrictive sense.

What is claimed is:

1. A heat sink, comprising:
a main heat pipe;
at least one pair of auxiliary heat pipes coupled to said main heat pipe, said auxiliary pipes extending substantially perpendicular to said main heat pipe, and the combined diameter of each said at least one pair of auxiliary pipes is substantially similar to the diameter of said main heat pipe;
a base plate, said base plate having channels to receive said main heat pipe and said auxiliary heat pipes, said base plate extending substantially perpendicular to a plane of a heat source with which said heat sink is used;
a diamond copper composite heat spreader disposed between the base plate and the heat source; and
a plurality of fins coupled to opposite sides of said base plate, said fins extending substantially parallel to the plane of said heat source;
wherein heat from the heat source is conducted through the heat spreader to the base plate and dissipated through the at least one heat pipe and the plurality of fins.

2. The heat sink of claim 1, wherein the diamond copper composite heat spreader comprises a first copper layer and a second copper layer, the first and second copper layers disposed on opposite sides of and in contact with a diamond copper layer.

3. The heat sink of claim 2, wherein the first copper layer comprises at least one channel to receive at least one heat pipe.

4. The heat sink of claim 2, wherein the diamond copper layer comprises 93% compressed diamond dust and 7% compressed copper.

5. The heat sink of claim 1, wherein each fin in the plurality of fins is aligned with each pipe in the plurality of auxiliary pipes along a flow length.

6. The heat sink of claim 1, wherein each pipe in the plurality of auxiliary heat pipes has an end portion that wraps partially around the main heat pipe.

7. The heat sink of claim 1, wherein the main heat pipe comprises an inner, diamond copper composite layer and an outer copper layer that is wrapped around the inner layer.

8. The heat sink of claim 7, wherein the inner diamond copper composite layer comprises 93% compressed diamond dust and 7% compressed copper.

9. The heat sink of claim 1, wherein at least one of the auxiliary heat pipes comprises an inner diamond copper composite layer and an outer copper layer that is wrapped around the inner layer.

10. The heat sink of claim 9, wherein the inner diamond copper composite layer comprises 93% compressed diamond dust and 7% compressed copper.

11. The heat sink of claim 7, wherein the inner diamond copper composite layer comprises DiaCu material.

12. The heat sink of claim 9, wherein the inner diamond copper composite layer comprises DiaCu material.

13. A heat sink, comprising:
a main heat pipe;
at least one pair of auxiliary heat pipes coupled to the main heat pipe, each pipe in the at least one pair of auxiliary pipes having a diameter that is less than a diameter of the main heat pipe;
wherein said auxiliary pipes extend substantially perpendicular to said main heat pipe; and
a diamond copper composite heat spreader is disposed between and in contact with the auxiliary heat pipes;
a wrap around plate that covers the main heat pipe and auxiliary heat pipes; and
a plurality of fins coupled to opposite sides of the wrap-around plate;
wherein pairs of auxiliary heat pipes are disposed proximate to opposite sides of the wrap around plate and are aligned along a length of the main heat pipe.

14. The heat sink of claim 13, wherein the diamond copper composite heat spreader comprises a first copper layer and a second copper layer, the first and second copper layers disposed on opposite sides of and in contact with a diamond copper layer.

15. The heat sink of claim 14, wherein the first copper layer comprises at least one channel to receive at least one heat pipe.

16. The heat sink of claim 14, wherein the diamond copper layer comprises 93% compressed diamond dust and 7% compressed copper.

17. The heat sink of claim 13, wherein each fin in the plurality of fins is aligned with each pipe in the plurality of auxiliary pipes along a flow length.

18. The heat sink of claim 13, wherein each pipe in the plurality of auxiliary heat pipes has an end portion that wraps partially around the main heat pipe.

19. The heat sink of claim 13, wherein channels are formed on an outer surface of the wrap around plate to receive the plurality of fins.

20. The heat sink of claim 13, wherein the main heat pipe comprises an inner, diamond copper composite layer and an outer copper layer that is wrapped around the inner layer.

21. The heat sink of claim 20, wherein the inner diamond copper composite layer comprises 93% compressed diamond dust and 7% compressed copper.

22. The heat sink of claim 13, wherein at least one of the auxiliary heat pipes comprises an inner diamond copper composite layer and an outer copper layer that is wrapped around the inner layer.

23. The heat sink of claim 22, wherein the inner diamond copper composite layer comprises 93% compressed diamond dust and 7% compressed copper.

24. The heat sink of claim 20, wherein the inner diamond copper composite layer comprises DiaCu material.

25. The heat sink of claim 22, wherein the inner diamond copper composite layer comprises DiaCu material.

* * * * *

UNITED STATES PATENT AND TRADEMARK OFFICE
CERTIFICATE OF CORRECTION

PATENT NO. : 7,861,768 B1  Page 1 of 1
APPLICATION NO. : 11/191343
DATED : January 4, 2011
INVENTOR(S) : Nayana V. Ghantiwala It is certified that error appears in the above-identified patent and that said Letters Patent is hereby corrected as shown below:

On Title Page 2, in column 2, under item (56); "Other Publications", line 1, delete "Perfomance" and insert -- Performance --, therefor.

On Title Page 2, in column 2, under item (56); "Other Publications", line 1, delete "decription," and insert -- description, --, therefor.

Signed and Sealed this
First Day of November, 2011

David J. Kappos
*Director of the United States Patent and Trademark Office*